(12) United States Patent
Park et al.

(10) Patent No.: US 6,664,160 B2
(45) Date of Patent: Dec. 16, 2003

(54) GATE STRUCTURE WITH HIGH K DIELECTRIC

(75) Inventors: Dae-Gyu Park, Ichon-shi (KR); Heung-Jae Cho, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 10/298,564

(22) Filed: Nov. 19, 2002

(65) Prior Publication Data

US 2003/0096467 A1 May 22, 2003

Related U.S. Application Data

(62) Division of application No. 09/883,188, filed on Jun. 19, 2001, now Pat. No. 6,511,875.

(30) Foreign Application Priority Data

Jun. 28, 2000 (KR) ........................................ 2000-35965

(51) Int. Cl.[7] ................................................ H01L 23/62
(52) U.S. Cl. ........................ 438/240; 257/368; 257/332
(58) Field of Search ................................ 257/368, 410, 257/407; 438/287, 563, 233

(56) References Cited

U.S. PATENT DOCUMENTS

| | | | | |
|---|---|---|---|---|
| 6,013,553 A | * | 1/2000 | Wallace et al. | 438/287 |
| 6,020,024 A | * | 2/2000 | Maiti et al. | 427/248.1 |
| 6,087,231 A | * | 7/2000 | Xiang et al. | 438/287 |
| 6,096,590 A | * | 8/2000 | Chan et al. | 438/233 |
| 6,200,866 B1 | * | 3/2001 | Ma et al. | 438/299 |
| 6,207,589 B1 | * | 3/2001 | Ma et al. | 438/785 |
| 6,221,712 B1 | * | 4/2001 | Huang et al. | 438/240 |
| 6,320,784 B1 | * | 11/2001 | Muralidhar et al. | 365/151 |
| 6,376,888 B1 | * | 4/2002 | Tsunashima et al. | 257/407 |

OTHER PUBLICATIONS

US patent application Paper US 2001/00533601 A1 By Mogami.*

* cited by examiner

*Primary Examiner*—David Nelms
*Assistant Examiner*—Thinh T. Nguyen
(74) *Attorney, Agent, or Firm*—Jacobson Holman PLLC

(57) ABSTRACT

A method for forming a gate structure beginning with a semiconductor substrate provided with an isolation region formed therein. An $HfO_2$ layer and a conductive layer are formed on the semiconductor substrate, subsequently. The conductive layer and the $HfO_2$ layer are patterned into the gate structure. By utilizing an $HfO_2$ layer as a gate dielectric, an effective K of the gate dielectric can be controlled to within 18 to 25. In addition, by employing a CVD method for forming the $HfO_2$ layer, it is possible to obtain a high K gate dielectric with excellent leakage current characteristic as well as a low interface state with both a gate electrode and a semiconductor substrate.

17 Claims, 6 Drawing Sheets

GATE STRUCTURE WITH HIGH K DIELECTRIC

This is a Divisional of application Ser. No. 09/883,188 filed on Jun. 19, 2001 now U.S. Pat. No. 6,511,875.

FIELD OF THE INVENTION

The present invention relates to a semiconductor device and, more particularly, to a method for manufacturing a gate structure incorporating a high K dielectric therein.

DESCRIPTION OF THE PRIOR ART

As is well known, a semiconductor device has been down-sized by a scale-down of a design rule. Therefore, a gate oxide tends to rapidly approach 30 Å in thickness and below to increase the capacitance between a gate electrode and a channel region. However, the use of silicon dioxide as a gate dielectric is limited at such thicknesses. Once silicon dioxide is formed to a thickness of less than 40 angstroms, direct tunneling may occur through the gate dielectric to the channel region, thereby increasing the leakage current associated with the gate electrode and the channel region, causing an increase in power consumption.

Since reducing the thickness of the gate dielectric inherently increases the gate-to-channel leakage current, alternative methods have been developed to reduce this leakage current while maintaining thin, $SiO_2$-equivalent, thickness. One of these methods is to use a high K dielectric material such as $Ta_2O_5$ as the gate dielectric material to increase the capacitance between the gate and the channel.

However, if a poly-silicon is utilized as a gate electrode, the use of $Ta_2O_5$ for the gate dielectric material has a disadvantage in integrating the semiconductor device. That is, an undesired $SiO_2$ and $TaSi_2$ are formed at an interface between $Ta_2O_5$ and the poly-silicon which, in turn, increases an equivalent oxide thickness. In order to overcome this problem, a barrier metal such as TiN is employed. However, the TiN changes a threshold voltage shift.

Therefore, there is still a demand for developing a high K dielectric as a gate oxide with excellent leakage current characteristic as well as a low interface state with both a gate electrode and a silicon substrate.

SUMMARY OF THE INVENTION

It is, therefore, an object of the present invention to provide a gate structure incorporating therein a high K dielectric for use in a semiconductor device.

It is another object of the present invention to provide a method for manufacturing a gate structure incorporating therein a high K dielectric for use in a semiconductor device.

In accordance with one aspect of the present invention, there is provided a gate structure for use in a semiconductor device, comprising a semiconductor substrate provided with an isolation region formed therein; a gate dielectric, made of $HfO_2$, formed on the semiconductor substrate; and a gate line on the gate dielectric.

In accordance with another aspect of the present invention, there is provided a gate structure for use in a semiconductor device, comprising a semiconductor substrate provided with an isolation region formed therein; a trench structure formed on the semiconductor substrate; a gate dielectric, made of $HfO_2$, formed on the trench structure; and a gate line on the gate dielectric.

In accordance with another aspect of the present invention, there is provided a method for manufacturing a gate structure for use in a semiconductor device, the method comprising the steps of a) preparing a semiconductor substrate provided with an isolation region formed therein; b) forming a dummy layer on the semiconductor substrate; c) patterning the dummy layer into a predetermined configuration; d) implanting dopants into the semiconductor substrate by using the patterned dummy layer as a mask, thereby obtaining a source and a drain; e) forming an inter-layer dielectric (ILD) on the semiconductor substrate and the patterned dummy layer; f) planarizing the ILD layer until a top surface of the patterned dummy layer is exposed; g) removing the patterned dummy layer, thereby opening a portion of semiconductor substrate; h) forming a $HfO_2$ layer on the exposed portion of the semiconductor substrate and the ILD layer; i) forming a conductive layer on the $HfO_2$ layer; and j) planarizing the conductive layer and the $HfO_2$ layer until a top surface of the ILD layer is exposed.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1 to 4 cross sectional views setting forth gate structures and methods for manufacturing the gate structures for use in a semiconductor device in accordance with preferred embodiments of the present invention.

Figure 1:
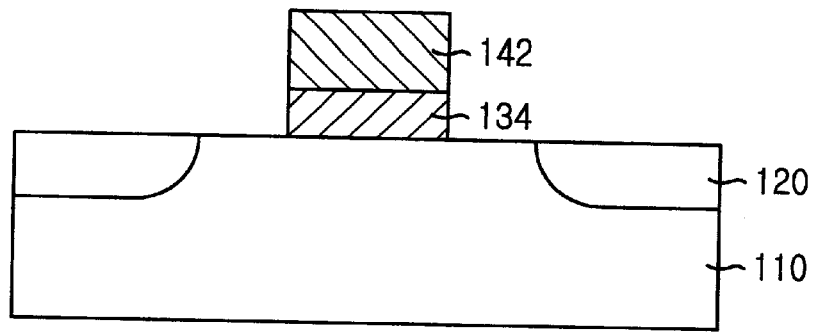
FIG. 1 is a cross sectional view setting forth a gate structure in accordance with a first preferred embodiment of the present invention.

In FIG. 1, there is provided a cross sectional view of the inventive gate structure 100 comprising a semiconductor substrate 110 provided with an isolation region 120 for defining an active region, a gate oxide 134 and a gate electrode 142.

In the gate structure 100 illustrating a first preferred embodiment, the gate oxide 134 is made of a high dielectric material such as $Hf_2O$. The isolation region 120 may be formed in a structure of local oxidation of silicon (LOCOS) or in a structure of shallow trench isolation (STI). The gate oxide layer 134 has an effective thickness ranging from approximately 10 Å to approximately 45 Å.

Figure 2A:
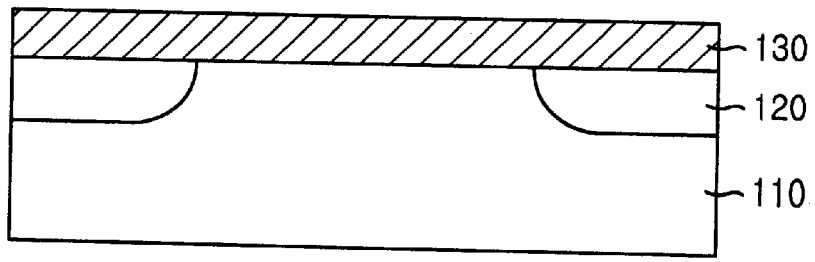
FIGS. 2A to 2C are cross sectional views illustrating a method for the manufacture of the gate structure shown in FIG. 1.

Referring to FIG. 2A, the process for manufacturing the gate structure 100 begins with the preparation of a semiconductor substrate 110 including an isolation region 120 for defining an active region. The isolation region 120 may be formed in a structure of local oxidation of silicon (LOCOS) or in a structure of shallow trench isolation (STI).

Optionally, the semiconductor substrate 110 can be cleaned by using a chemical such as a mixture of $H_2SO_4$ and $H_2O_2$ at a hydrogen gas atmosphere to remove an undesired silicon dioxide ($SiO_2$) formed thereon. Alternatively, the semiconductor substrate 110 may be cleaned by a solution prepared by mixing ammonium hydroxide (NH$_4$OH), hydrogen peroxide (H$_2$O$_2$) and deionized (DI) water. It is preferable that the cleaning process be carried out at a temperature ranging from approximately 850° C. to approximately 950° C. in ultra high vacuum (UHV). An ultra thin silicon dioxide (not shown) can be formed on top of the cleaned silicon substrate 110. Thereafter, a Hf$_2$O layer 130 is formed on top of the semiconductor substrate 110 by using an atomic layer deposition (ALD) method, as shown in FIG. 2A. In the preferred embodiment, the ALD method is carried out by dosing the precursor in the presence of a gas selected from a group consisting of N$_2$ gas, NH$_3$ gas and ND$_3$ gas; and purging the precursor by using a gas selected from a group consisting of N$_2$ gas, NH$_3$ gas and ND$_3$ gas. A H$_2$O vapor is utilized as an oxygen source and a precursor of Hf is selected from a group consisting of Hf tert-butaoxide (Hf[OC(CH$_3$)]$_4$), Hf(th)Cl$_4$ and HfCl$_4$. The HfO$_2$ layer 130 has an effective thickness (or an equivalent oxide thickness) ranging from approximately 10 Å to approximately 45 Å.

Alternatively, the HfO$_2$ layer 130 can be formed by using a chemical vapor deposition (CVD) method. The CVD method utilizes a Hf tert-butaoxide (Hf[OC(CH$_3$)]$_4$) as a precursor of Hf and a gas selected from a group consisting of O$_2$, N$_2$O and D$_2$O as an oxygen source. In addition, the HfO$_2$ layer 130 can be formed by using a plasma CVD. In this case, the plasma CVD utilizes an excited gas selected from a group consisting of He, Ar, Kr and Xe as a source gas. The plasma source is controlled by using a remote control in the microwave range of 1–9 GHz and a wafer is maintained at a temperature ranging from approximately 200° C. to approximately 250° C. In addition, the HfO$_2$ layer 130 is annealed by using a rapid thermal process (RTP) in order to improve the characteristics thereof. It is preferable that the RTP is carried out in the presence of O$_2$ or N$_2$O at a temperature ranging from approximately 500° C. to approximately 800° C. for 10–120 seconds. It is also preferable that a ramp rate be 20–80° C./sec. Alternatively, the annealing process can be carried out in a furnace in the presence of O$_2$, N$_2$, or N$_2$O at a temperature ranging from approximately 450° C. to approximately 800° C. for 10–60 minutes. The annealing process can also be carried out by using an UV-Ozone at a temperature ranging from approximately 300° C. to approximately 500° C. for 1–20 minutes.

Figure 2B:
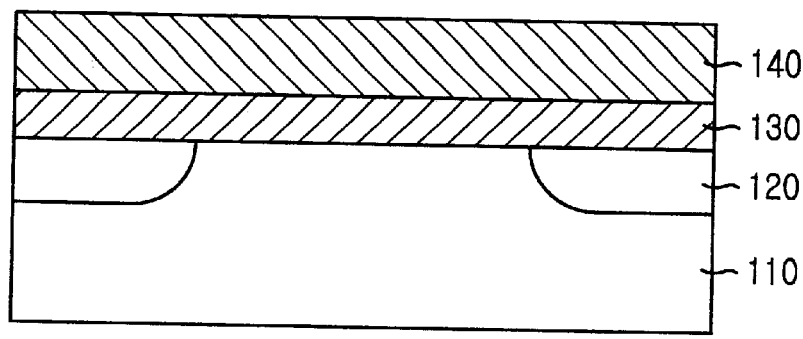

In an ensuing step, shown in FIG. 2B, a conductive layer 140 is formed on the Hf$_2$O layer 130. The conductive layer 140 is made of a material selected from a group consisting of doped poly-Si, amorphous-Si, W-polycide, Ti-polycide, Co-polycide, W, W/WN stack, Ta, denuded WN and TaN.

Figure 2C:
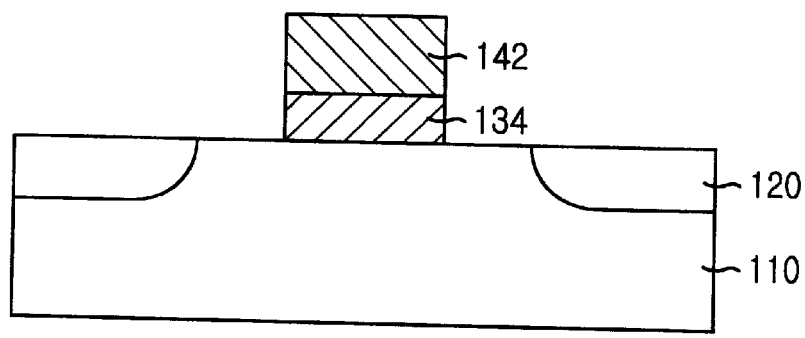

Thereafter, the conductive layer 140 and the Hf$_2$O layer 130 are patterned into the gate oxide 134 and the gate electrode 142, as shown in FIG. 2C.

Figure 3:
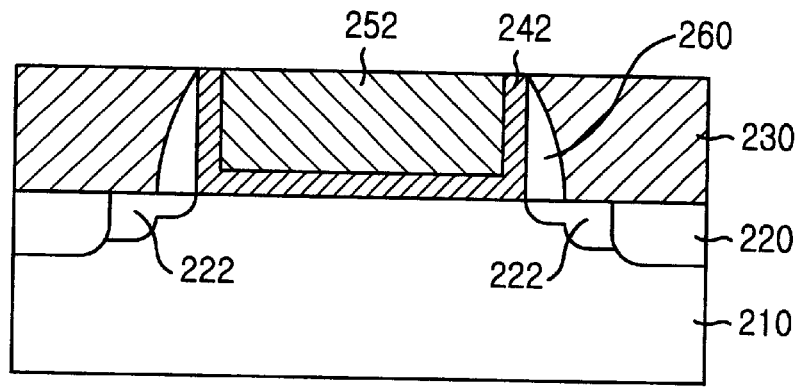
FIG. 3 depicts a cross sectional view showing a gate structure in accordance with a second preferred embodiment of the present invention.

In FIG. 3, there is provided a cross sectional view of a gate structure 200 in accordance with a second preferred embodiment of the present invention, comprising a semiconductor substrate 210 provided with a source/drain 222 and an isolation region 220 for defining an active region, a gate oxide 242, a gate electrode 252, a spacer 260 and an inter-layer dielectric (ILD) layer 230.

The gate structure 200 of the second preferred embodiment is similar to that of the first preferred embodiment except that the gate oxide 242 is formed in the form of trench. Further, the second preferred embodiment has the spacer 260 formed on sides of the gate oxide 242.

Figure 4A:
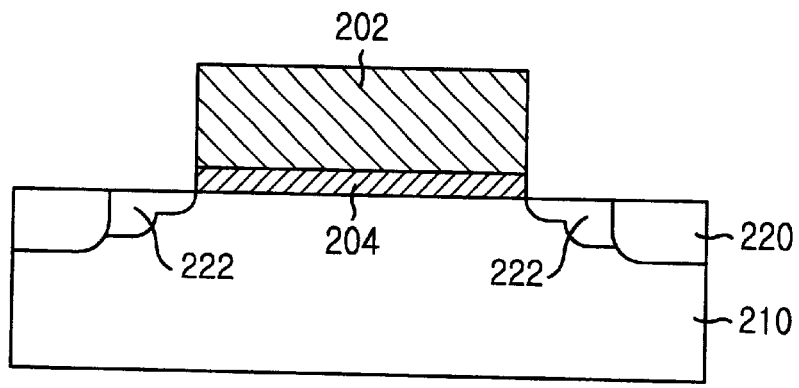
FIGS. 4A to 4F are cross sectional views setting forth a method for the manufacture of the gate structure shown in FIG. 3.

Referring to FIG. 4A, the process for manufacturing the gate structure 200 begins with the preparation of a semiconductor substrate 210 including an isolation region 220 for defining an active region. The isolation region 220 may be formed in a structure of local oxidation of silicon (LOCOS) or in a structure of shallow trench isolation (STI). Thereafter, a dummy gate oxide and a dummy poly-Si, layer are formed on the semiconductor substrate 210, sequentially. The dummy gate oxide and the dummy poly-Si layer are patterned into a predetermined configuration, thereby obtaining a patterned dummy gate oxide layer 204 and a patterned dummy poly-Si layer 202. Dopants are implanted into the semiconductor substrate 210 to form a source/drain 222, wherein the patterned dummy poly-Si layer 202 is utilized as a mask.

Figure 4B:
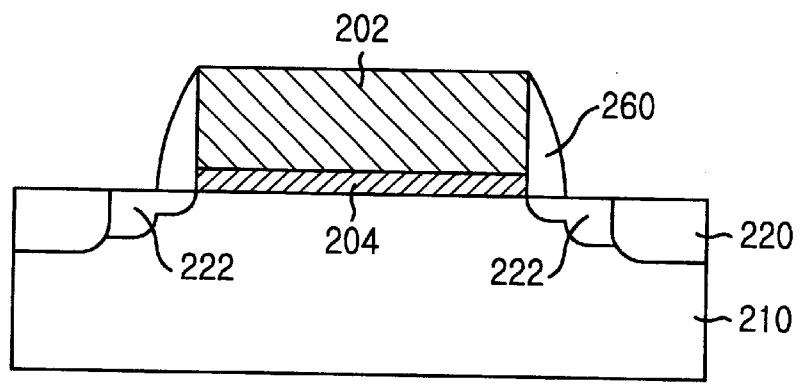

Referring to FIG. 4B, during the patterning process, a spacer 260 is formed around the patterned dummy gate oxide layer 204 and the patterned dummy poly-Si layer 202 is exposed.

Figure 4C:
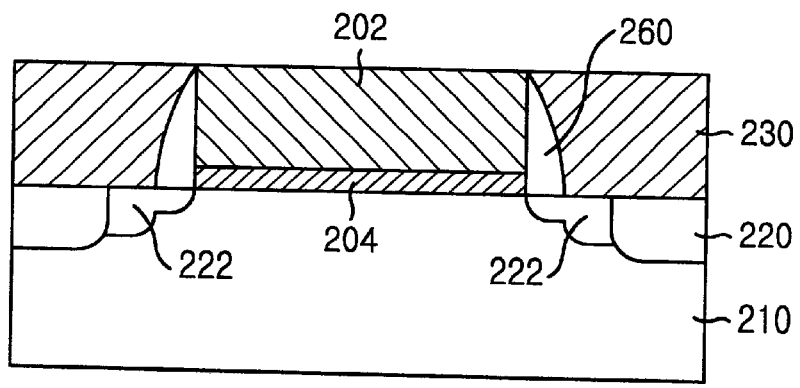

Referring to FIG. 4C, an ILD layer 230 is formed on top of the patterned dummy poly-Si layer 202 and the semiconductor substrate 210. The ILD layer 230 is planarized by using a method such as a chemical mechanical polishing (CMP) until a top surface of the patterned dummy poly-Si layer 202 is exposed.

Figure 4D:
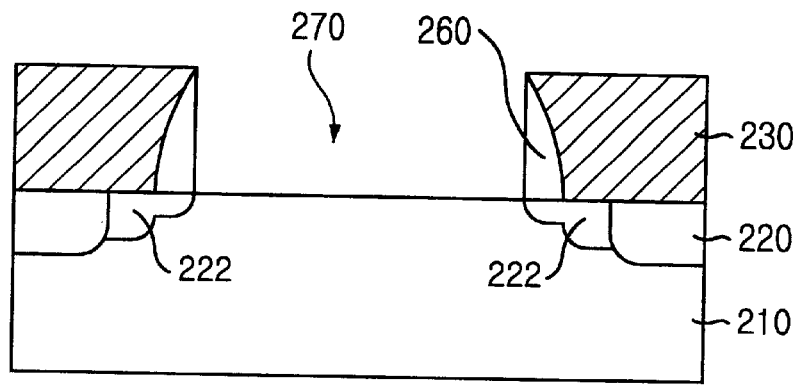

Referring to FIG. 4D, the patterned dummy gate oxide layer 204 and the patterned dummy poly-Si layer 202 are removed by using a method such as a wet etching, thereby obtaining a trench 270 which exposes a portion of the semiconductor substrate 210.

Figure 4E:
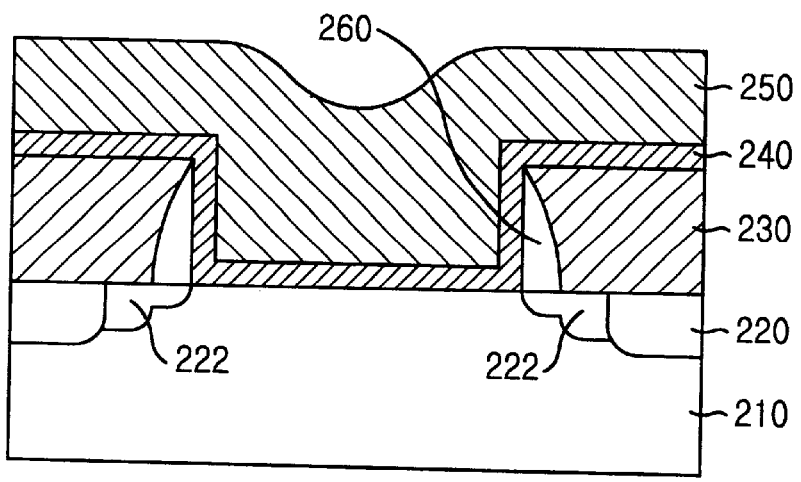

Referring to FIG. 4E, a HfO$_2$ layer 240 and then a conductive layer 250 are subsequently formed on the ILD layer 230 and the trench. In this embodiment, the method of forming the HfO$_2$ layer 240 is similar to that used to form the HfO$_2$ layer 130.

Figure 4F:
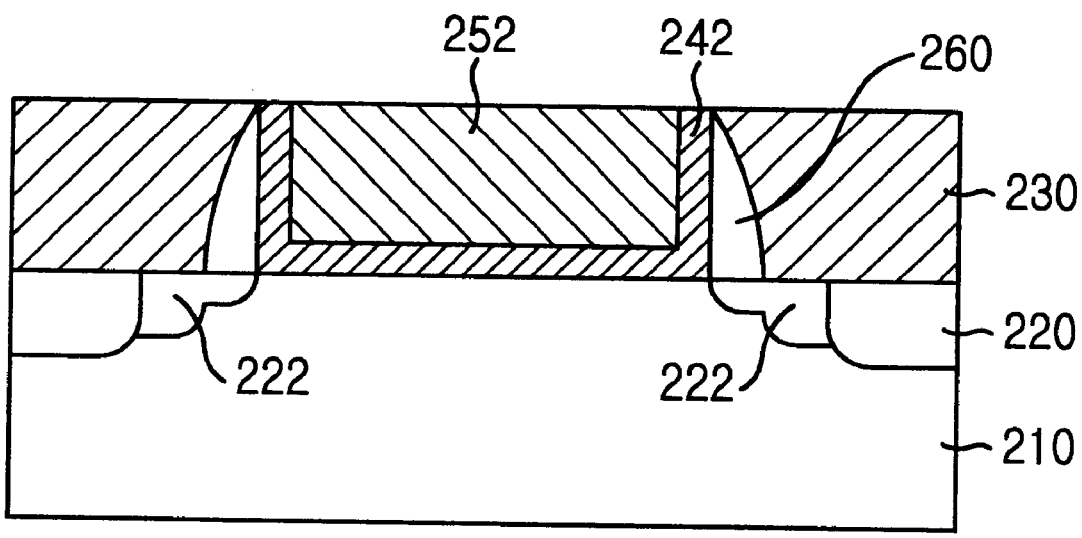

Referring to FIG. 4F, the conductive layer 250 and the HfO$_2$ layer 240 are planarized until a top surface of the ILD layer 230 is exposed, thereby obtaining the gate oxide 242 and the gate electrode 252. Finally, the remaining ILD layer 230 is removed (not shown) by using an etching process.

In the present invention, by utilizing an HfO$_2$ layer as a gate dielectric, an effective K of the gate dielectric can be controlled to within 18 to 25. In addition, by employing a CVD method for forming the HfO$_2$ layer, the present invention can obtain a high K gate dielectric with excellent leakage current characteristic as well as a low interface state with both a gate electrode and a semiconductor substrate.

While the present invention has been described with respect to the particular embodiments, it will be apparent to those skilled in the art that various changes and modifications may be made without departing from the scope of the invention as defined in the following claims.

What is claimed is:

1. A gate structure for use in a semiconductor device, comprising: a semiconductor substrate provided with an isolation region formed therein and formed in a form of a local oxidation of silicon (LOCOS) or a shallow trench isolation (STI); a gate dielectric, made of HfO$_2$, formed on the semiconductor substrate; and a gate line on the gate dielectric.

2. A gate structure for use in a semiconductor device, comprising: a semiconductor substrate provided with a source/drain and an isolation region formed therein; a trench structure formed on the semiconductor substrate; a gate dielectric, made of HfO$_2$, formed on the trench structure by using an atomic layer deposition (ALD); and a gate line on the gate dielectric.

3. The gate structure for use in the semiconductor device as recited in claim 1, wherein the HfO$_2$ layer is formed by using an atomic layer deposition (ALD).

4. The gate structure for use in the semiconductor device as recited in claim 3, wherein the $HfO_2$ layer formed by the ALD has an electrical thickness ranging from approximately 10 Å to approximately 45 Å.

5. The gate structure for use in the semiconductor device as recited in claim 1, wherein the $HfO_2$ layer is formed by using a $H_2O$ vapor as an oxygen source.

6. The gate structure for use in the semiconductor device as recited in claim 5, wherein the $HfO_2$ layer is formed by using a material selected from a group consisting of Hf tert-butaoxide (Hf $[OC(CH_3)]_4$), Hf(th)$Cl_4$ and $HfCl_4$ as a precursor of Hf.

7. The gate structure for use in the semiconductor device as recited in claim 1, wherein the $HfO_2$ layer is formed by using a chemical vapor deposition (CVD).

8. The gate structure for use in the semiconductor device as recited in claim 7, wherein a Hf tetra-butaoxide as a precursor of Hf and a gas selected from a group consisting of $O_2$, $N_2O$ and $D_2O$ as an oxygen source are used for forming the $HfO_2$ layer.

9. The gate structure for use in the semiconductor device as recited in claim 1, wherein the $HfO_2$ layer is formed by using a plasma CVD.

10. The gate structure for use in the semiconductor device as recited in claim 8 the plasma CVD is carried out by using an exited gas selected from a group consisting of He, Ar, Kr and Xe as a source gas.

11. The gate structure for use in the semiconductor device as recited in claim 1, comprising an ultra thin silicon dioxide formed between the $HfO_2$ layer and the semiconductor substrate.

12. The gate structure for use in the semiconductor device as recited in claim 1, wherein the $HfO_2$ layer is annealed by using a rapid thermal process (RTP).

13. The gate structure for use in the semiconductor device as recited in claim 1, wherein the conductive layer includes a material selected from a group consisting of doped poly-Si, amorphous-Si, W-polycide, Ti-polycide, Co-polycide, W, W/WN stack, Ta, denouded WN and TaN.

14. The gate structure for use in the semiconductor device as recited in claim 2, wherein the $HfO_2$ layer has an electrical thickness ranging from approximately 10 Å to approximately 45 Å.

15. The gate structure for use in the semiconductor device as recited in claim 2, wherein the $HfO_2$ layer is formed by using a $H_2O$ vapor as an oxygen source.

16. The gate structure for use in the semiconductor device as recited in claim 2, wherein the $HfO_2$ layer is formed by using a material selected from a group consisting of Hf tert-butaoxide (Hf $[OC(CH_3)]_4$), Hf(th)$Cl_4$ and $HfCl_4$ as a precursor of Hf.

17. A gate structure useful in a semiconductor device and comprising:
   a semiconductor substrate with an isolation region therein, wherein the isolation region is in local oxidation of silicon (LOCOS) form or in shallow trench isolation (STI) form;
   a gate dielectric, made of $HfO_2$, on the semiconductor substrate; and
   a gate line on the gate dielectric.

* * * * *